(12) United States Patent
Iravani et al.

(10) Patent No.: US 8,284,560 B2
(45) Date of Patent: Oct. 9, 2012

(54) EDDY CURRENT SENSOR WITH ENHANCED EDGE RESOLUTION

(75) Inventors: Hassan G. Iravani, San Jose, CA (US); Ingemar Carlsson, Milpitas, CA (US); Boguslaw A. Swedek, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 347 days.

(21) Appl. No.: 12/616,761

(22) Filed: Nov. 11, 2009

(65) Prior Publication Data

US 2010/0124792 A1     May 20, 2010

Related U.S. Application Data

(60) Provisional application No. 61/114,924, filed on Nov. 14, 2008.

(51) Int. Cl.
     *H05K 7/00* (2006.01)
(52) U.S. Cl. ........ 361/760; 324/100; 324/229; 324/242; 324/243; 324/662; 702/104; 702/105; 451/5; 451/6; 451/10; 451/11
(58) Field of Classification Search .................. 324/100, 324/229, 242, 243, 662; 438/17, 692; 451/5, 451/6, 10, 11; 702/104, 105
     See application file for complete search history.

(56) References Cited

U.S. PATENT DOCUMENTS

| | | | |
|---|---|---|---|
| 2,608,860 A | 9/1952 | Ramey et al. | |
| 4,000,458 A | 12/1976 | Miller et al. | |
| 4,005,359 A | 1/1977 | Smoot | |
| 4,303,885 A | 12/1981 | Davis et al. | |
| 4,467,281 A | 8/1984 | Davis et al. | |
| 4,556,845 A | 12/1985 | Strope et al. | |
| 4,715,007 A | 12/1987 | Fujita et al. | |
| 4,716,366 A | 12/1987 | Hosoe et al. | |
| 4,771,238 A | 9/1988 | Caruso et al. | |
| 4,829,251 A | 5/1989 | Fischer | |
| 5,003,262 A | 3/1991 | Egner et al. | |
| 5,142,228 A | 8/1992 | Kingsbury | |

(Continued)

FOREIGN PATENT DOCUMENTS

EP     0 460 348 A2     12/1991

(Continued)

OTHER PUBLICATIONS

Lee, Chang Yong, Korean Authorized Officer, International Search Report and the Written Opinion in PCT/US2009/064067 dated May 27, 2010, 11 pgs.

(Continued)

*Primary Examiner* — Tuan T Dinh
*Assistant Examiner* — Hung Dang
(74) *Attorney, Agent, or Firm* — Fish & Richardson P.C.

(57) ABSTRACT

An apparatus for monitoring the thickness of a conductive layer on a substrate includes a support to hold a substrate having a conductive layer, an eddy current monitoring system including a first plurality of core portions, and a motor to cause relative motion between the support and the eddy current monitoring system such that the substrate moves across the first plurality of core portions in a direction that defines a first axis. At least one core portion is positioned further from a second axis than at least two other core portions. The second axis is orthogonal to the first axis.

22 Claims, 5 Drawing Sheets

U.S. PATENT DOCUMENTS

| | | | |
|---|---|---|---|
| 5,213,655 A | 5/1993 | Leach et al. | |
| 5,237,271 A | 8/1993 | Hedengren | |
| 5,343,146 A | 8/1994 | Koch et al. | |
| 5,355,083 A | 10/1994 | George et al. | |
| 5,541,510 A | 7/1996 | Danielson | |
| 5,559,428 A | 9/1996 | Li et al. | |
| 5,570,017 A | 10/1996 | Blum | |
| 5,644,221 A | 7/1997 | Li et al. | |
| 5,660,672 A | 8/1997 | Li et al. | |
| RE35,703 E | 12/1997 | Koch et al. | |
| 5,731,697 A | 3/1998 | Li et al. | |
| 6,057,684 A | 5/2000 | Murakami et al. | |
| 6,072,320 A | 6/2000 | Verkuil | |
| 6,232,775 B1 | 5/2001 | Naitoh et al. | |
| 6,621,264 B1* | 9/2003 | Lehman et al. | 324/230 |
| 6,707,540 B1 | 3/2004 | Lehman et al. | |
| 6,741,076 B2 | 5/2004 | Le | |
| 7,112,960 B2* | 9/2006 | Miller et al. | 324/230 |
| 7,112,961 B2 | 9/2006 | Lei et al. | |
| 7,128,803 B2 | 10/2006 | Owczarz et al. | |
| 7,508,201 B2* | 3/2009 | Tada et al. | 324/230 |
| 7,795,865 B2* | 9/2010 | Fujita et al. | 324/229 |
| 8,106,651 B2* | 1/2012 | Lahiri et al. | 324/230 |
| 2002/0047705 A1 | 4/2002 | Tada et al. | |
| 2002/0077031 A1 | 6/2002 | Johansson et al. | |
| 2003/0148706 A1 | 8/2003 | Birang et al. | |
| 2004/0140797 A1 | 7/2004 | Lei et al. | |
| 2004/0150500 A1 | 8/2004 | Kiko | |
| 2004/0207395 A1 | 10/2004 | Sarfaty et al. | |
| 2006/0009128 A1 | 1/2006 | Hanawa et al. | |
| 2007/0103150 A1* | 5/2007 | Tada et al. | 324/229 |
| 2008/0064301 A1* | 3/2008 | Birang et al. | 451/8 |

FOREIGN PATENT DOCUMENTS

| | | |
|---|---|---|
| EP | 1 116 552 A2 | 7/2001 |
| FR | 2 473 168 | 3/1979 |
| WO | 01/46684 | 6/2001 |

OTHER PUBLICATIONS

G.L. Miller et al., "Contactless measurement of semiconductor conductivity by radio frequency-free-carrier power absorption," in final form, Mar. 24, 1976; Review of Scientific Instruments, vol. 47, No. 7, Jul. 1976; Copyright © 1976 American Institute of Physics, pp. 799-805.

* cited by examiner

EDDY CURRENT SENSOR WITH ENHANCED EDGE RESOLUTION

CROSS-REFERENCE TO RELATED APPLICATIONS

This application claims the benefit of U.S. Provisional Application Ser. No. 61/114,924, filed Nov. 14, 2008, and is incorporated herein by reference.

BACKGROUND

The present disclosure relates generally to semiconductor processing, and more particularly to systems and methods for eddy current metrology.

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier or polishing head. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical or capacitance sensors may be used for in-situ or in-line monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In general, in one aspect, an apparatus for monitoring the thickness of a conductive layer on a substrate includes a support to hold a substrate having a conductive layer, an eddy current monitoring system including a first plurality of core portions, and a motor to cause relative motion between the support and the eddy current monitoring system such that the substrate moves across the first plurality of core portions in a direction that defines a first axis. At least one core portion is positioned further from a second axis than at least two other core portions. The second axis is orthogonal to the first axis. This and other embodiments can optionally include one or more of the following features.

The first plurality of core portions can extend in parallel perpendicular to the first and second directions. Each of the core portions in the first plurality of core portions can have widths in the first and second directions and a height perpendicular to the first and second directions that is greater than the widths. The first plurality of core portions can extend perpendicularly from a back portion.

The first plurality of core portions can be positioned along a path intersecting and normal to the first axis. The path can be an arc and have a radius of curvature approximately equal to the substrate.

The core portions positioned progressively farther along the first axis in the first direction can be progressively closer to the first axis. A first distance between core portions positioned furthest apart along the first axis can be less than a second distance between core portions positioned furthest apart along the second axis. The second distance can be at least twice the first distance and can be between about one centimeter and about five centimeters. The first distance can be less than about one centimeter.

The apparatus can include a coil coupled with at least one of the first plurality of core portions. The apparatus can include a drive system to generate a current in the coil and a sense system to derive a characteristic of a conductive region of the substrate based on eddy currents generated in the conductive region of the substrate. The first plurality of core portions can include a first core portion and a second core portion, and the coil can be coupled with the first and second core portions in a figure eight configuration. The coil can be coupled with the plurality of core portions such that application of current to the coil induces magnetic fields in opposite directions in adjacent core portions. The coil can be wound in opposite directions around adjacent core portions.

The first plurality of core portions can include a ferrite material. A second plurality of core portions can be positioned substantially opposite to the first plurality of core portions to define a predetermined gap therebetween for passage by a substrate.

The apparatus can include a platen to hold a polishing pad to polish the substrate. The first plurality of core portions can be positioned in the platen. The support can be a carrier head.

The apparatus can include a factory interface unit having a robot that includes the support to transfer the substrate from a cassette to a processing station. The first plurality of core portions can be positioned in the factory interface unit. A controller can be configured to cause the robot to move the substrate in the first direction across the first plurality of core portions.

As used in the instant specification, the term substrate can include, for example, a product substrate (e.g., which can include multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Certain implementations may have one or more of the following advantages. An elongated core can provide a more consistent measurement along the edge of a substrate by averaging out the thickness along a substrate near the edge area. Core portions positioned in a curved arrangement that follows the curvature of a substrate can allow film thickness of the substrate to be measured with higher edge resolution near the substrate edge. Moreover, use of two opposing core portions in an in-line measurement system can improve the accuracy of measurements because the device will be significantly less sensitive to inadvertent movement or vibration of a given sampling location toward or away from the sensor head resulting from passage of the test object through the gap.

The details of one or more embodiments are set forth in the accompanying drawings and the description below. Other features, aspects, and advantages will become apparent from the description, the drawings, and the claims.

BRIEF DESCRIPTION OF THE DRAWINGS

Like reference numbers and designations in the various drawings indicate like elements.

DETAILED DESCRIPTION

In some semiconductor processes, it may be important to know the thickness of a conductive region on the substrate. For example, in order to determine an endpoint of a metal chemical mechanical polishing process, the thickness of the metal layer may need to be monitored. The polishing process may be terminated based on measurements related to the thickness of the metal layer.

The thickness of a conductive material may be measured at different regions on the substrate. For example, the thickness of a metal layer at different regions on a substrate may be monitored to ensure that processing is proceeding uniformly across the substrate. Thickness information for regions of the substrate (which collectively may be referred to as a "profile" of the substrate) may then be used to adjust processing parameters to obtain improved within-wafer or wafer-to-wafer uniformity. For example, in a chemical mechanical polishing (CMP) process, the thickness of a metal layer at different regions on the substrate can be monitored, and detected non-uniformities can cause the CMP system to adjust polishing parameters.

During CMP, it may be more difficult to accurately determine the thickness at the edge of a substrate. However, the core in an eddy current monitoring system can be modified to more accurately follow the curvature of the substrate such that more accurate thickness measurements can be made.

Figure 1:
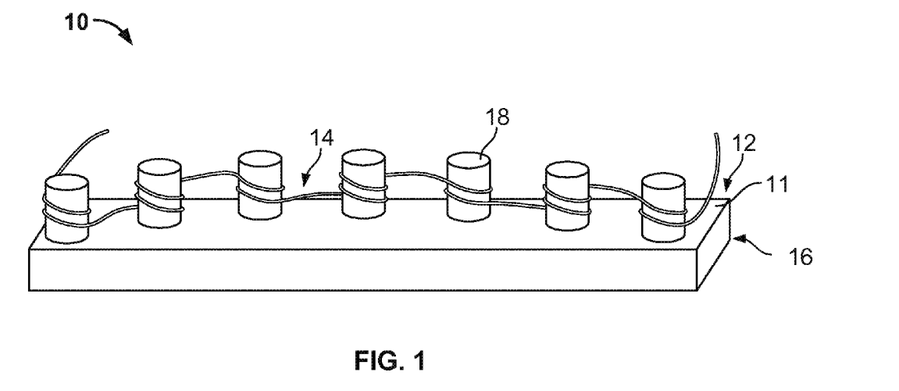
FIG. 1 is a schematic diagram of a representative eddy current sensor head.

FIG. 1 schematically illustrates a representative eddy current sensor head 10 that can be used in a thickness measurement device in accordance with various embodiments of the invention. The eddy current sensor head 10 includes a core 12 and a coil 14. The core 12 is formed of a high permeability material, e.g. the core can be ferrite. Core 12 can be coated with a corrosion-resistant or non-wetting coating. For example, core 12 may be coated with a material such as parylene to prevent water from entering pores in core 12 and to prevent coil shorting.

Figure 2:
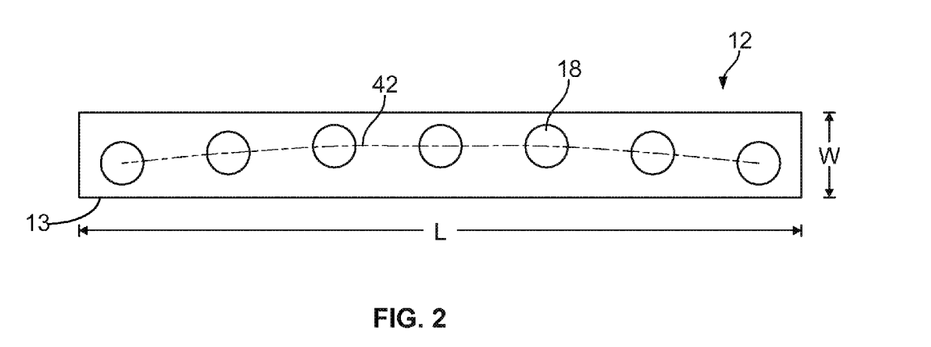
FIG. 2 is a schematic diagram showing the core portions positioned along a curve.
Figure 3:
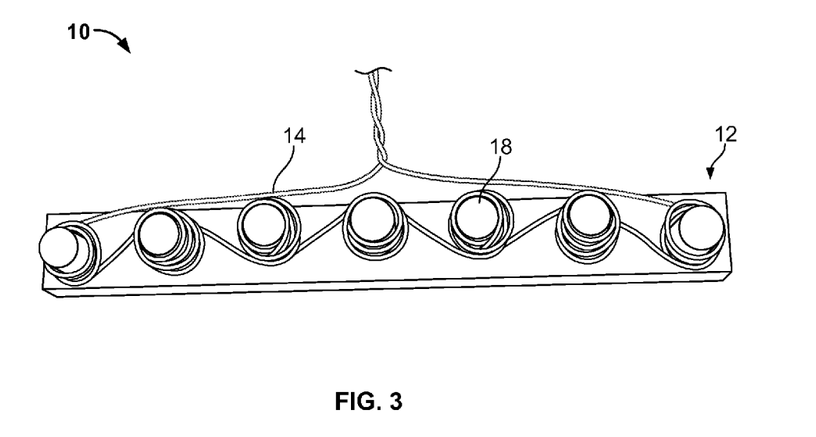
FIG. 3 is a top view of an exemplary elongated core having coils wound around core portions.

The core 12 can be a can be an elongated core as shown in FIGS. 1, 2, and 3. The core 12 can have multiple core portions 18 that extend in parallel upwards from a back portion 16. The core portions 18 can extend, e.g., have a primary axis (e.g., an axis of minimum moment of inertia), perpendicularly to the primary axis of the back portion 16. In addition, the back portion 16 can have a planar upper surface 11, e.g., the back portion can be a rectangular solid, and core portions 18 can extend perpendicularly to the surface 11. Although seven core portions are shown in FIG. 1, another number, such as between three and fifteen, is also possible.

Referring to FIG. 2, the length L of the core 12 is greater than the width W. That is, the aspect ratio L/W is greater than one. Different values for L, W, and L/W of the core may be used for different implementations. For example, W may range from a fraction of a millimeter to more than a centimeter, while L may range from about a millimeter (for smaller values of W) to ten centimeters or greater. In particular implementations, W is between about a millimeter and about ten millimeters while L is between about one centimeter to about five centimeters. More particularly, the length may be about 34 millimeters, and the width may be about 4 millimeters.

Each core portion 18 can have the same length, width, and height as other core portions. The core portions 18 can be cylindrical and be about 2 millimeters in width or diameter. The height of the base (i.e., along the direction away from the base) may be about 2 millimeters. The height of the core portions can be about 3 millimeters, although the height can be increased if desired to allow for more coil turns. The height can be greater than the width of the core portion. The distance between adjacent portions can be equal and can be about 3 millimeters. The values here are exemplary; many other configurations are possible.

As shown in FIG. 2, the core portions 18 can be positioned in such a manner as to follow the curvature of a substrate edge. The core portions 18 can be arranged in a symmetrical curved path 42, e.g., an arc, such as an arc having a radius of curvature equal to the radius of a substrate, to closely follow the substrate edge. For example, if there are seven core portions, the distance from the bottom edge 13 of the core along an axis that is perpendicular to the base 18 to the center of the first and seventh core portions can be 1.6 millimeters. The distance along the same perpendicular axis from the edge 13 of the core to the center of the second and sixth core portions can be 2.1 millimeters. The distance along the same perpendicular axis from the edge 13 of the core to the center of the third, fourth, and fifth core portions can be 2.4 millimeters. Other arrangements of core portions that follow the curvature of the wafer edge are contemplated. For example, the core portions could make a path that a V-shape that closely follows the wafer edge.

The coil 14 may be litz wire (woven wire constructed of individual film insulated wires bunched or braided together in a uniform pattern of twists and length of lay), which may be less glossy than solid wire for the frequencies commonly used in eddy current sensing. By way of example, the coil 14 can comprise 26032 gauge wire.

As shown in FIGS. 1 and 3, the coil 14 can be wound around adjacent core portions 18 in alternating directions, i.e. in a figure-eight pattern, in order to create opposing magnetic fields in adjacent core portions 18.

The coil can be wrapped around each core portion between six and twelve times. For example, the coil can wrap around the first core portion in a clockwise direction four times to create a first layer of coil and then three more times to create a second layer. The coil can then be wrapped around a second core portion nine times to create a first layer and then three more turns to create a second layer. Each remaining portion can then be wrapped in two layers of six and nine turns, respectively, in alternating directions until the last core portion. The last portion can then be wrapped four times to create a first layer and one more time to create a second layer.

Figure 4:
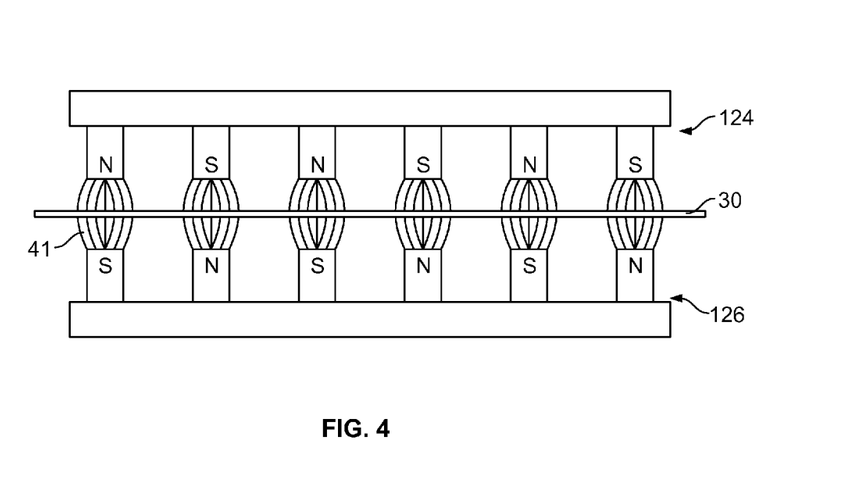
FIG. 4 is a schematic illustration of representative flux lines of the dual eddy current sensor cores.

In some implementations, such as an in-line system, described below, two eddy current sensor heads 124, 126 on opposite sides of a substrate can be used (FIG. 4). As shown in FIG. 4, core portions that are wound in opposite directions are positioned directly across from each other to create opposing magnetic poles. Such an arrangement will create magnetic flux lines 41 between the sensor heads.

If two eddy current sensor heads are used in an in-line system, as in FIG. 4, then inadvertent movement of a given sampling location toward or away from the sensor heads (resulting from movement of the test object through the gap) does not significantly affect the measurement. Accordingly, more accurate measurements can be made at each sampling location. Also, the need for extensive positioning control mechanisms is avoided, and the measurements can be made more quickly. The sensor readings can be continually made as the substrate 30 moves through the gap between the eddy current sensor heads.

Figure 5:
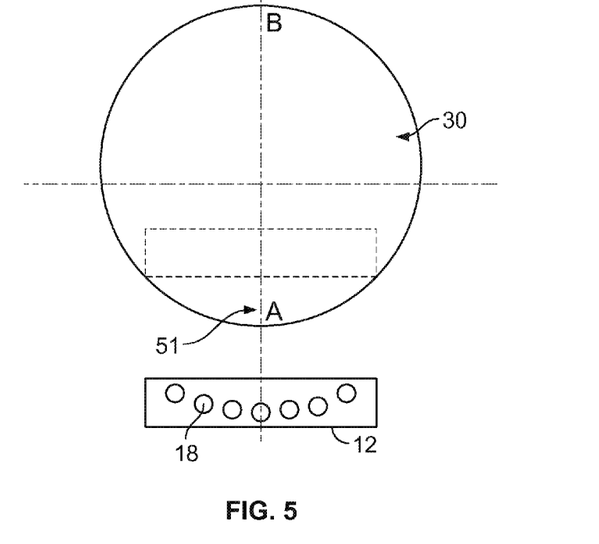
FIG. 5 is a schematic view of an exemplary chemical mechanical polishing apparatus using an elongated core.

An eddy current monitoring system for use with a core 12 as described can include a support to allow movement of the substrate. As shown in FIG. 5, a substrate 30 can move across the core 12. The substrate can move in a straight line. The substrate can also move along a curved path. In both configurations, as the substrate passes over the sensor, it can intersect the path formed by core portions with the path normal to the direction of travel of the substrate. For example, in FIG. 5, for a scan along a slice A-B through the center of a substrate 30 having a radius R, core 12 is oriented so that its long axis is perpendicular to a radius of substrate 30. Its short axis is parallel to a radius of substrate 30. In some implementations, the long axis of an elongated core may not be exactly perpendicular to a radius of a substrate.

The substrate can be held such that the core portions 18 extend perpendicular to the flat surface of the substrate.

If the arrangement of core portions 18 is linear, then as the substrate 30 moves across the first segment 51 of the radius, some of the core portions 18 will not be proximate to the substrate 30. Therefore, the measurement for segment 51, near the edge of the wafer, will be less accurate and may place a limit on the maximum desirable length L of core 12. However, core 12 shown in FIG. 5 has core portions in a curved arrangement such that core portions positioned progressively farther along the path of travel of the substrate are progressively closer to the path. Such positioning can allow more of the core 12 to be proximate to the substrate 30 than if the core 12 were not curved.

In operation, the coil 14, when driven by an AC current, generates an oscillating magnetic field that induces eddy currents locally in a conductive region of interest (e.g. a portion of a metal layer on a semiconductor wafer). The AC current used to drive the coils can vary. For example, the driving current can be at frequencies between about 300 kHz and 5 MHz. Other current values are also possible.

Figure 6:
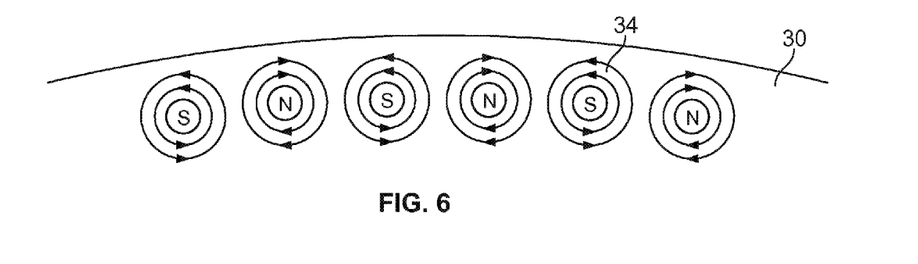
FIG. 6 is a schematic of eddy currents generated in a substrate using a core having a plurality of core portions.

As shown in FIG. 6, the eddy currents 34 formed by eddy current sensor head 10 having core portions 18 and coil 14 wrapped in alternating directions will circulate in opposite directions in regions next to adjacent core portions. Note that the magnetic field produced by a coil would around core portions 18 induces eddy currents in a conductive region that is elongated in shape as well, e.g., an arc-shape, with a length greater than width (see FIG. 6). However, the length and the width of core 12, and the aspect ratio and cross section of the conductive region is generally different than that of core 12 as well.

The eddy currents cause the conductive regions of the substrate to act as an impedance source in parallel with a sense coil and a capacitor. As the thickness of the conductive region of the substrate changes, the impedance changes, resulting in a change in the Q-factor of the system. By detecting the change in the Q-factor, the eddy current sensing mechanism can sense the change in the strength of the eddy currents, and thus the change in the thickness of the conductive region. Therefore, eddy current sensing systems may be used to determine parameters of the conductive region, such as a thickness of the conductive region, or may be used to determine related parameters, such as a polishing endpoint. Note that although the thickness of a particular conductive region is described above, the relative position of core 12 and the conductive layer may change, so that thickness information for a number of different conductive regions on a substrate, e.g., regions at different radial positions on the substrate, is obtained.

Improved spatial resolution in eddy current monitoring systems can be particularly beneficial for CMP. Obtaining high resolution wafer profile information allows for more accurate adjustment of processing parameters, and thus may enable fabrication of devices with smaller CDs.

One way to increase spatial resolution is to localize eddy currents in a smaller region on the substrate. By having multiple core portions 18 extend perpendicularly and coil 14 wrapped around each core 18 in alternating directions, eddy currents will become more localized, and spatial resolution can be increased. In such a configuration, the spatial resolution of the system will be limited by the distance between the core portions 18. Therefore, smaller distances between the centers of core portions can create greater measurement resolutions. Moreover, if two eddy current sensor heads are used as in FIG. 4, more localized eddy currents can be created.

In some implementations, the core may be shielded to more precisely direct the flux lines toward a particular portion of a conductive layer and thus to improve spatial resolution. For example, metal pieces, e.g., metal plates, could be positioned between adjacent core portions to prevent leakage of the magnetic fields.

Spatial resolution can also be improved by using a core that is long in one direction and narrow in another. The core length can be chosen such that it makes a more consistent measurement by averaging out the thickness along the wafer circumference near the edge area. Moreover, when the core portions are extended along a path that follows the curvature of the substrate, spatial resolution at the edge of the substrate can be improved. Although this system results in the spatial resolution that is lower at the center of the substrate than at the substrate edge, since substrate profile tends to be more uniform near its center than at its edge, this can be an acceptable trade-off.

Spatial resolution can further be improved by reducing the distance between the core and the conductive layer. Use of two eddy current sensor heads as in FIG. 4 can allow reduce the distance between the core and conductive layer. In such a configuration, the substrate 30 can be moved toward or away from respective sensor heads 124, 126 with a significantly reduced change in the number of flux lines intersected. Accordingly, the device has reduced sensitivity to variations in distance between the test object and the eddy current sensor heads.

Other types of eddy current sensor heads can also be used. These include, e.g., sensor heads with two coils, in which a primary coil is driven by an AC current and generates an oscillating magnetic field, and a secondary pickup coil receives a responsive signal from the test object.

Figure 7:
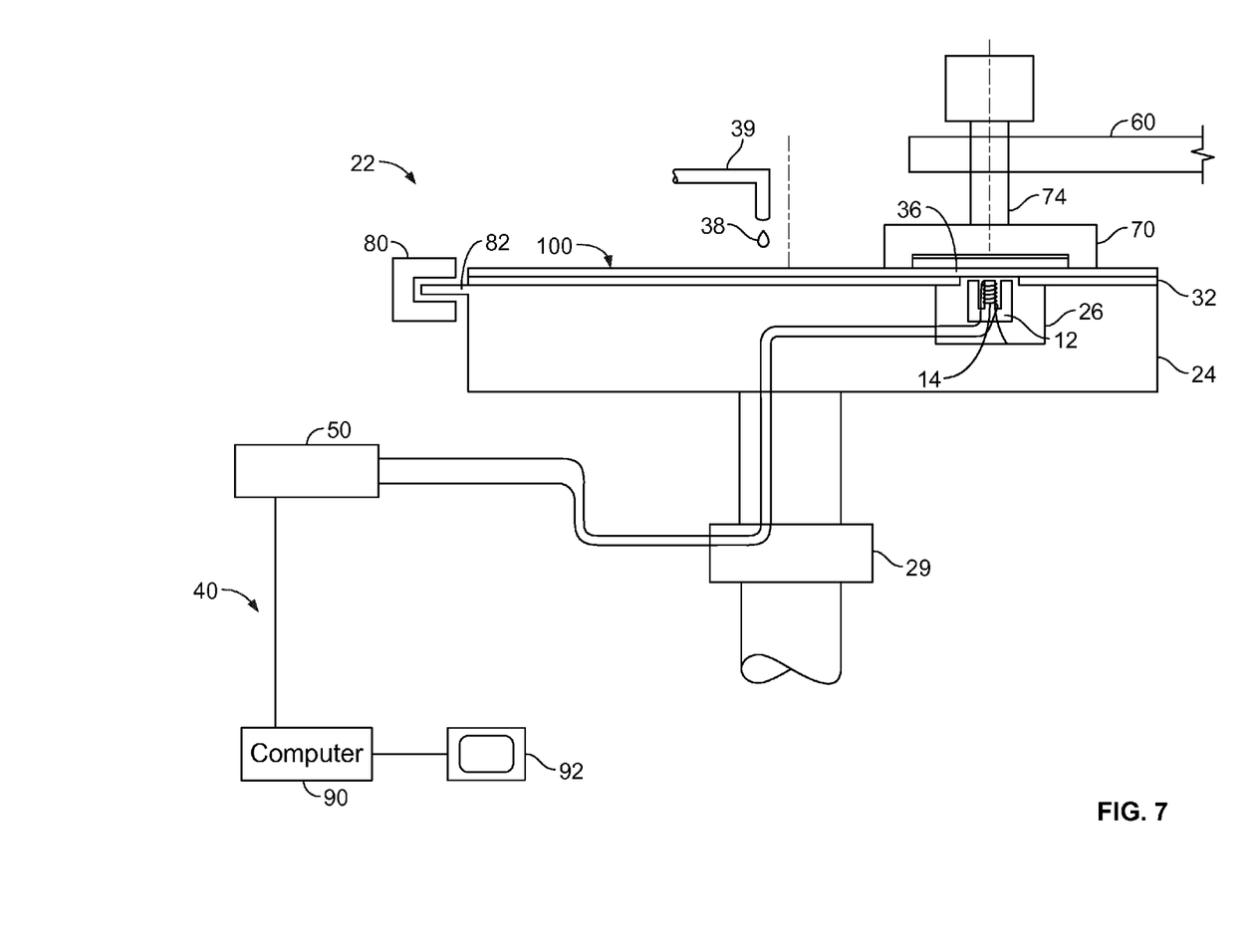
FIG. 7 is a side view of an exemplary in-situ eddy current metrology system.

In one embodiment, shown in FIG. 7, an in-situ chemical mechanical polishing apparatus 22 may be used with an eddy current sensing system such as those described above. One or more substrates can be polished by CMP apparatus 22. Each apparatus includes a rotatable platen 24 on which is placed a polishing pad 100. The polishing pad 100 can have a hard durable outer surface or a fixed-abrasive pad with embedded abrasive particles or a relatively soft surface.

A carousel 60 can support multiple carrier heads 70. Each carrier head 70 is connected by a carrier drive shaft 74 to a carrier head rotation motor (not shown) so that each carrier had can independently rotate about its own axis. A slurry 38 containing a reactive agent (e.g., deionized water for oxide polishing) and a chemically-reactive catalyzer (e.g. potassium hydroxide for oxide polishing) can be supplied to the surface of polishing pad 100 by a slurry supply port or combined slurry/rinse arm 39. If polishing pad 100 is a standard pad, slurry 38 can also include abrasive particles (e.g. silicon dioxide for oxide polishing). A recess 26 is formed in the platen 24, and a thin section 36 can be formed in polishing pad 100 overlying recess 26. Aperture 26 and thin pad section 36, if needed, are positioned such that they pass beneath substrate 30 during a portion of the platen's rotation, regardless of the translational position of the carrier head. The thin section 36 can allow core 12 to be positioned in close proximity to a substrate.

As shown in FIG. 7, CMP apparatus 22 can also include a position sensor 80, such as an optical interrupter, to sense when core 12 is beneath substrate 30. For example, the optical interrupter could be mounted at a fixed point opposite carrier head 70. A flag 82 may be attached to the periphery of the platen. The point of attachment and length of flag 82 is selected so that it interrupts the optical signal of sensor 80 while core 12 sweeps beneath substrate 30. Alternatively, the CMP apparatus can include an encoder to determine the angular position of the platen.

Referring to FIG. 7, an eddy current monitoring system 40 may include drive and feedback circuitry 50, including an oscillator such as a marginal oscillator. The core 12 and the coil 14 of the eddy current sensing system located below thin section 36 of polishing pad 32 sweep beneath the substrate of the platen. Note that although a single coil 14 is shown here, separate sensing circuitry can be provided. Circuitry 50 may be located apart from platen 24, and can be coupled to the components in the platen through a rotary electrical union 29.

A computer 90 can receive measurements from circuitry 50, and can be programmed to divide the measurements from each sweep of the core beneath the substrate into a plurality of sampling zones, to calculate the radial positions of each sampling zone, to sort the measurements into radial ranges, to determine minimum, maximum and average measurements for each sampling zone, and to use multiple radial ranges to determine the polishing endpoint. Note that the measurements may be amplitude measurements, phase measurements, and/or drive current measurements, depending on the configuration of system 40. Output from computer 90 may be displayed on an output device 92 during polishing to permit a user to visually monitor the progress of the polishing operation.

Moreover, after sorting the eddy current measurements into radial ranges, information on the metal film thickness can be fed in real-time into a closed-loop controller to periodically or continuously modify the polishing pressure profile applied by a carrier head. For example, the computer could determine that the endpoint criteria have been satisfied for the outer radial ranges but not for the inner radial ranges. This would indicate that the underlying layer has been exposed in an annular outer area but not in an inner area of the substrate. In this case, the computer could reduce the diameter of the area in which pressure is applied so that pressure is applied only to the inner area of the substrate, thereby reducing dishing and erosion on the outer area of the substrate. Alternatively, the computer can halt polishing of the substrate on the first indication that the underlying layer has been exposed anywhere on the substrate, i.e., at first clearing of the metal layer.

Figure 8:
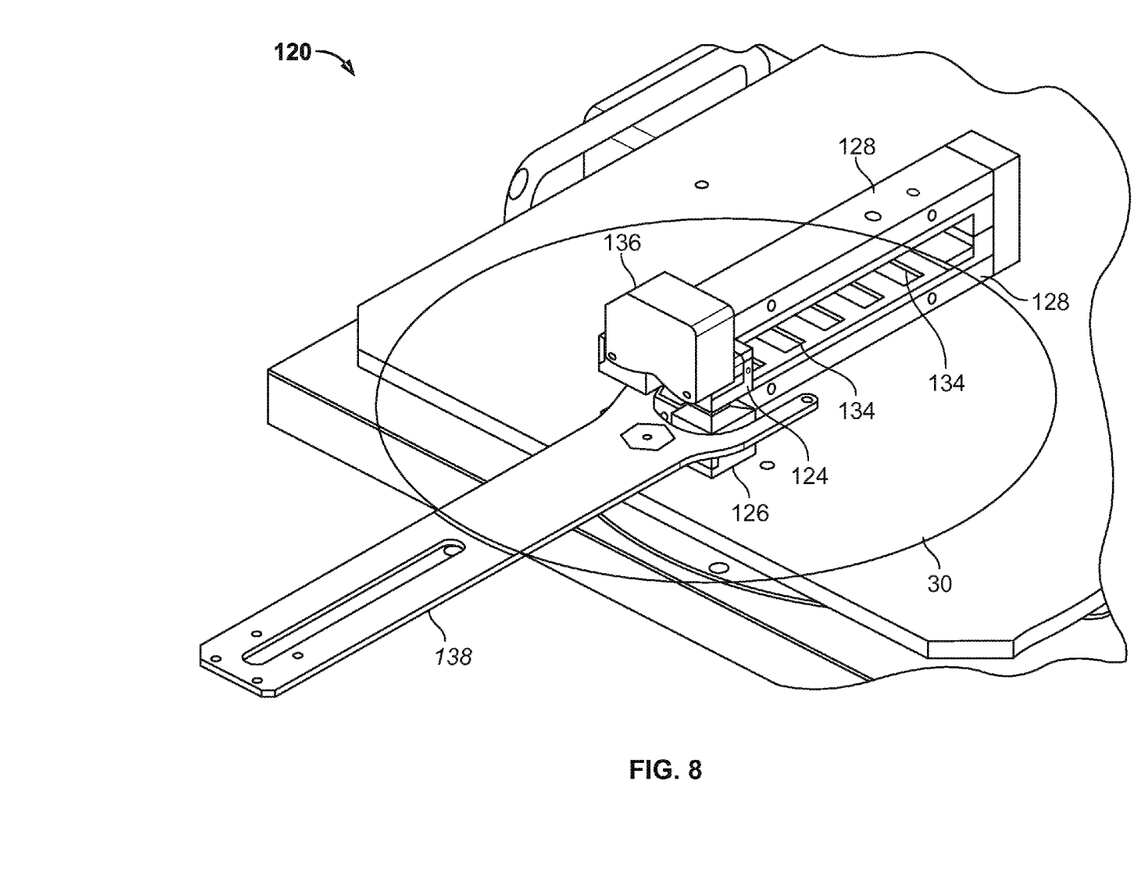
FIG. 8 is a perspective view of an exemplary in-line eddy current metrology system.

In another embodiment, shown in FIG. 8, an in-line chemical mechanical polishing apparatus 120 may be used with an eddy current sensing system such as those described above. The apparatus 120 includes an eddy current sensor, which has two sensor heads 124, 126, that can be connected in either a serial or parallel circuit. The sensor heads 24, 26 are mounted on respective brackets 128 such that they are spaced a predetermined distance from each other, forming a gate or gap therebetween. The gate distance can be varied depending on the size of the test object being measured. A typical range for use, e.g., in semiconductor manufacturing for measuring the thickness of layers deposited on wafers can be between about 2 6 mm. Such a range has been found to provide suitable spot size, signal strength and handling reliability in typical semiconductor processing applications.

The eddy current sensor heads 124, 126 can be connected to a sensor board circuit, which generates the AC current for driving the sensor heads 124, 126 and which receives a pickup eddy current signal from the sensor heads 124, 126 indicative of the substrate thickness. The pickup eddy current signal with voltage form is transmitted to a controller (not shown), which can include an analog to digital converter for converting the pickup signal to a digital signal for processing as will be described below.

The device 120 also includes an array of position sensors 134, which detect the position of the substrate 30 as it is moved through the gap between the eddy current sensor heads 124, 126. The position sensors 134 are connected to the controller, which can determine the sampling locations on the substrate 30 when thickness measurements are made. One example of a position sensor that can be used in the array is an optical sensor such as a through-beam type sensor. Examples of suitable position sensors include the model EX-11 sensor commercially available from SUNX of Japan.

To further increase measurement accuracy, one or more embodiments of the present invention contemplate the inclusion of a Z-position sensor 136 to measure the distance between the substrate 30 and the sensor heads 124, 126 in order to determine any distance related compensation factor that can be applied to the raw data to compensate for distance and vibration effects. One example of a suitable Z-position sensor is a laser distance sensor. An example of such a sensor is the model XZ-30V sensor commercially available from OMRON of Japan.

The controller computes the thickness of the substrate 30 at the various sampling locations based on respective readings from the sensors. A representative controller can include an analog to digital converter, a PLC (Programmable Logic Control) and a PC (personal computer). The analog to digital converter converts analog signals from the eddy current sensor and the Z-position sensor to digital form for processing. The PLC receives sensing signals from the sensors and performs data logging or collection functions. The PC receives data from the PLC and performs measurement and compensation calculations. The measurement results can be output to an output device (not shown) such as, e.g., a computer display or printer.

Various known methods can be used for computing the thickness of the test object from the eddy current sensor readings of an in-line metrology system. For example, one such known method uses empirical data of eddy current sensor readings taken of particular test objects having known thicknesses to generate sensor reading calibration curves. In use of the device, eddy current sensor readings can be mapped to the calibration curves to determine the thickness of measured test objects.

For example, substrate 30 can positioned on an end effector 138 connected to a robotic arm. The robotic arm is then actuated by a controller to move the substrate 30 through the gate formed by the pair of eddy current sensor heads 124, 126. As the substrate 30 moves through the gate, it passes the array of position sensors 134, which are successively tripped or actuated by the leading edge of the substrate 30. A sensing routine is triggered when the substrate 30 passes the first position sensor 134. The sensing routine can include the eddy current sensor taking periodic thickness readings (e.g., at a sampling rate of 1,000 readings/second), and the position sensors 134 detecting when the wafer edge passes each successive sensor to determine the velocity of the wafer. Using this information, the controller can determine the measured thickness at each sampling location and the position of each sampling location on the wafer. In this manner, thickness measurements can be taken along a given line extending across the wafer. Measurements along different lines across the substrate 30 can be taken, if desired, by rotating the substrate 30 to a desired position and then moving it through the device 120 while making measurements.

Particular embodiments of the invention have been described. Other embodiments are within the scope of the following claims.

What is claimed is:

1. An apparatus for monitoring a thickness of a conductive layer on a substrate, comprising:
   a support configured to hold the substrate with a face of the substrate in a first plane during monitoring;
   an eddy current monitoring system including a first plurality of core portions; and
   a motor to cause relative motion between the support and the eddy current monitoring system such that the first plurality of core portions move relative to the substrate in a first direction parallel to the first plane;
   wherein the first plurality of core portions are spaced apart in a second direction and separated by gaps, the second direction parallel to the first plane and perpendicular to the first direction, and
   wherein at least one core portion of the first plurality of core portions is positioned a different distance in the first direction from a first reference line than at least two other core portions, the first reference line being parallel to the first plane and orthogonal to the first direction.

2. The apparatus of claim 1, wherein the first plurality of core portions extend in parallel and normal to the first plane.

3. The apparatus of claim 1, wherein the first plurality of core portions are positioned along a path, and wherein the path is normal to the first direction at about a midpoint of the path.

4. The apparatus of claim 1, wherein a first distance between core portions positioned furthest apart along a first axis parallel to the first direction is less than a second distance between core portions positioned furthest apart along a second axis perpendicular to the first axis.

5. The apparatus of claim 1, further comprising a coil coupled with at least one of the first plurality of core portions.

6. The apparatus of claim 1, wherein the first plurality of core portions comprise a ferrite material.

7. The apparatus of claim 1, further comprising a second plurality of core portions positioned substantially opposite to the first plurality of core portions to define a predetermined gap therebetween for passage by the substrate.

8. The apparatus of claim 1, further comprising a platen to hold a polishing pad to polish the substrate, wherein the first plurality of core portions are positioned in the platen, and wherein the support is a carrier head.

9. The apparatus of claim 1, further comprising a factory interface unit having a robot that comprises the support to transfer the substrate from a cassette to a processing station, and wherein the first plurality of core portions are positioned in the factory interface unit.

10. The apparatus of claim 2, wherein each of the first plurality of core portions has a first width in the first direction and a second width in the second direction and a height in a third direction perpendicular to the first direction and the second direction, the height greater than the first width and the second width.

11. The apparatus of claim 2, wherein the first plurality of core portions extend perpendicularly from a back portion.

12. The apparatus of claim 3, wherein the path is an arc.

13. The apparatus of claim 4, wherein the second distance is at least twice the first distance.

14. The apparatus of claim 4, wherein the second distance is between about one centimeter and about five centimeters.

15. The apparatus of claim 4, wherein the first distance is less than about one centimeter.

16. The apparatus of claim 5, further comprising:
   a drive system to generate a current in the coil; and
   a sense system to derive a characteristic of a conductive region of the substrate based on eddy currents generated in the conductive region of the substrate.

17. The apparatus of claim 5, wherein the first plurality of core portions include a first core portion and a second core portion, and wherein the coil is wound in opposite directions around the first core portion and the second core portion.

18. The apparatus of claim 9, further comprising a controller configured to cause the robot to move the substrate in the first direction across the first plurality of core portions.

19. The apparatus of claim 12, wherein the arc has a radius of curvature approximately equal to the substrate.

20. The apparatus of claim 5, wherein the coil is coupled with the plurality of core portions such that application of current to the coil induces magnetic fields in opposite directions in adjacent core portions.

21. The apparatus of claim 1, wherein core portions positioned progressively farther along a first axis parallel to the first direction are progressively closer to the first axis.

22. The apparatus of claim 20, wherein the coil is wound in opposite directions around adjacent core portions.

* * * * *